United States Patent
Goodwin et al.

(10) Patent No.: US 7,606,049 B2
(45) Date of Patent: Oct. 20, 2009

(54) MODULE THERMAL MANAGEMENT SYSTEM AND METHOD

(75) Inventors: Paul Goodwin, Austin, TX (US); James W. Cady, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 675 days.

(21) Appl. No.: 11/125,018

(22) Filed: May 9, 2005

(65) Prior Publication Data
US 2006/0049502 A1 Mar. 9, 2006

Related U.S. Application Data

(63) Continuation-in-part of application No. 11/068,688, filed on Mar. 1, 2005, now Pat. No. 7,324,352, which is a continuation-in-part of application No. 11/007,551, filed on Dec. 8, 2004, now Pat. No. 7,511,968, application No. 11/125,018, which is a continuation-in-part of application No. 11/005,992, filed on Dec. 7, 2004, now Pat. No. 7,480,152, said application No. 11/068,688 is a continuation-in-part of application No. 10/934,027, filed on Sep. 3, 2004.

(51) Int. Cl.
*H05K 7/00* (2006.01)
(52) U.S. Cl. .................. 361/783; 361/704; 257/678; 257/724
(58) Field of Classification Search .................. 361/783, 361/704; 257/724, 678
See application file for complete search history.

(56) References Cited

U.S. PATENT DOCUMENTS

| | | | |
|---|---|---|---|
| 3,372,310 | A | 3/1968 | Kantor |
| 3,436,604 | A | 4/1969 | Hyltin |
| 3,582,865 | A | 6/1971 | Franck et al. |

(Continued)

FOREIGN PATENT DOCUMENTS

EP   122-687 (A)   10/1984

(Continued)

OTHER PUBLICATIONS

U.S. Appl. No. 11/306,803, filed Jan. 11, 2006, Chris Karabatsos.

(Continued)

*Primary Examiner*—Dean A. Reichard
*Assistant Examiner*—Andargie M Aychillhum
(74) *Attorney, Agent, or Firm*—Fish & Richardson P.C.

(57) ABSTRACT

A circuit module shunts thermal energy into a chassis component or a part of the box of the computing application in which the module is employed. In one preferred mode, a flex circuit is populated along each of its first and second major sides with two ranks of ICs which are, preferably, array type (CSP) devices. Insertion contacts are disposed in two sets on the first side of the flex circuit typically between the two ranks of ICs along the first side of the IC. A substrate with first and second lateral sides provides a form for the module. That substrate is preferably comprised of metallic material and exhibits an edge about which the flex circuit is wrapped and an extension at the other extremity of the substrate that is thermally connected to a chassis component of the application, either directly or, preferably, through a thermal conduit such as a thermally conductive compliant material.

20 Claims, 9 Drawing Sheets

U.S. PATENT DOCUMENTS

| | | |
|---|---|---|
| 3,654,394 A | 4/1972 | Gordon |
| 3,704,455 A | 11/1972 | Scarbrough |
| 3,718,842 A | 2/1973 | Abbott, III et al. |
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 4,169,642 A | 10/1979 | Mouissie |
| 4,288,841 A | 9/1981 | Gogal |
| 4,342,069 A | 7/1982 | Link |
| 4,429,349 A | 1/1984 | Zachry |
| 4,437,235 A | 3/1984 | McIver |
| 4,513,368 A | 4/1985 | Houseman |
| 4,547,834 A | 10/1985 | Dumont et al. |
| 4,567,543 A | 1/1986 | Miniet |
| 4,587,596 A | 5/1986 | Bunnell |
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,724,611 A | 2/1988 | Hagihara |
| 4,727,513 A | 2/1988 | Clayton |
| 4,733,461 A | 3/1988 | Nakano |
| 4,739,589 A | 4/1988 | Brehm et al. |
| 4,763,188 A | 8/1988 | Johnson |
| 4,771,366 A | 9/1988 | Blake et al. |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,053,853 A | 10/1991 | Haj-Ali-Ahmadi et al. |
| 5,065,277 A | 11/1991 | Davidson |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,138,430 A | 8/1992 | Gow, III et al. |
| 5,138,434 A | 8/1992 | Wood et al. |
| 5,140,405 A | 8/1992 | King et al. |
| 5,159,535 A | 10/1992 | Desai et al. |
| 5,173,840 A | 12/1992 | Kodai et al. |
| 5,191,404 A | 3/1993 | Wu et al. |
| 5,208,729 A | 5/1993 | Cipolla et al. |
| 5,214,845 A | 6/1993 | King et al. |
| 5,219,377 A | 6/1993 | Poradish |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewicz et al. |
| 5,247,423 A | 9/1993 | Lin et al. |
| 5,252,857 A | 10/1993 | Kane et al. |
| 5,259,770 A | 11/1993 | Bates et al. |
| 5,261,068 A | 11/1993 | Gaskins et al. |
| 5,268,815 A | 12/1993 | Cipolla et al. |
| 5,276,418 A | 1/1994 | Klosowiak et al. |
| 5,281,852 A | 1/1994 | Normington |
| 5,285,398 A | 2/1994 | Janik |
| 5,289,062 A | 2/1994 | Wyland |
| 5,309,986 A | 5/1994 | Itoh |
| 5,313,097 A | 5/1994 | Haj-Ali-Ahmadi et al. |
| 5,347,428 A | 9/1994 | Carson et al. |
| 5,362,656 A | 11/1994 | McMahon |
| 5,375,041 A | 12/1994 | McMahon |
| 5,386,341 A | 1/1995 | Olson et al. |
| 5,394,300 A | 2/1995 | Yoshimura |
| 5,397,916 A | 3/1995 | Normington |
| 5,400,003 A | 3/1995 | Kledzik |
| 5,428,190 A | 6/1995 | Stopperan |
| 5,438,224 A | 8/1995 | Papageorge et al. |
| 5,448,511 A | 9/1995 | Paurus et al. |
| 5,477,082 A | 12/1995 | Buckley, III et al. |
| 5,491,612 A | 2/1996 | Nicewarner, Jr. et al. |
| 5,502,333 A | 3/1996 | Bertin et al. |
| 5,523,619 A | 6/1996 | McAllister et al. |
| 5,523,695 A | 6/1996 | Lin |
| 5,541,812 A | 7/1996 | Burns |
| 5,572,065 A | 11/1996 | Burns |
| 5,600,178 A | 2/1997 | Russell |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,661,339 A | 8/1997 | Clayton |
| 5,686,730 A | 11/1997 | Laudon et al. |
| 5,688,606 A | 11/1997 | Mahulikar et al. |
| 5,708,297 A | 1/1998 | Clayton |
| 5,714,802 A | 2/1998 | Cloud et al. |
| 5,717,556 A | 2/1998 | Yanagida |
| 5,729,894 A | 3/1998 | Rostoker et al. |
| 5,731,633 A | 3/1998 | Clayton |
| 5,744,862 A | 4/1998 | Ishii |
| 5,751,553 A | 5/1998 | Clayton |
| 5,754,409 A | 5/1998 | Smith |
| 5,764,497 A | 6/1998 | Mizumo |
| 5,776,797 A | 7/1998 | Nicewarner, Jr. et al. |
| 5,789,815 A | 8/1998 | Tessier et al. |
| 5,790,447 A | 8/1998 | Laudon et al. |
| 5,802,395 A | 9/1998 | Connolly et al. |
| 5,805,422 A | 9/1998 | Otake et al. |
| 5,828,125 A | 10/1998 | Burns |
| 5,835,988 A | 11/1998 | Ishii |
| 5,869,353 A | 2/1999 | Levy et al. |
| 5,899,705 A | 5/1999 | Akram |
| 5,917,709 A | 6/1999 | Johnson et al. |
| 5,925,934 A | 7/1999 | Lim |
| 5,926,369 A | 7/1999 | Ingraham et al. |
| 5,949,657 A | 9/1999 | Karabatsos |
| 5,953,214 A | 9/1999 | Dranchak et al. |
| 5,953,215 A | 9/1999 | Karabatsos |
| 5,959,839 A | 9/1999 | Gates |
| 5,963,427 A | 10/1999 | Bollesen |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,008,538 A | 12/1999 | Akram et al. |
| 6,014,316 A | 1/2000 | Eide |
| 6,021,048 A | 2/2000 | Smith |
| 6,025,992 A | 2/2000 | Dodge et al. |
| 6,028,352 A | 2/2000 | Eide |

| | | | | | | |
|---|---|---|---|---|---|---|
| 6,028,365 | A | 2/2000 | Akram et al. | 6,514,793 B2 | 2/2003 | Isaak |
| 6,034,878 | A | 3/2000 | Osaka et al. | 6,521,984 B2 | 2/2003 | Matsuura |
| 6,038,132 | A | 3/2000 | Tokunaga et al. | 6,528,870 B2 | 3/2003 | Fukatsu et al. |
| 6,040,624 | A | 3/2000 | Chambers et al. | 6,531,772 B2 | 3/2003 | Akram et al. |
| 6,049,975 | A | 4/2000 | Clayton | 6,544,815 B2 | 4/2003 | Isaak |
| 6,060,339 | A | 5/2000 | Akram et al. | 6,552,910 B1 | 4/2003 | Moon et al. |
| 6,072,233 | A | 6/2000 | Corisis et al. | 6,552,948 B2 | 4/2003 | Woo et al. |
| 6,078,515 | A | 6/2000 | Nielsen et al. | 6,560,117 B2 | 5/2003 | Moon |
| 6,084,294 | A | 7/2000 | Tomita | 6,566,746 B2 | 5/2003 | Isaak et al. |
| 6,091,145 | A | 7/2000 | Clayton | 6,572,387 B2 | 6/2003 | Burns et al. |
| 6,097,087 | A | 8/2000 | Farnworth et al. | 6,573,593 B1 | 6/2003 | Syri et al. |
| 6,111,757 | A | 8/2000 | Dell et al. | 6,576,692 B1 * | 6/2003 | Ohtsuka et al. ............. 524/151 |
| 6,121,676 | A | 9/2000 | Solberg | 6,576,992 B1 | 6/2003 | Cady et al. |
| RE36,916 | E | 10/2000 | Moshayedi | 6,588,095 B2 | 7/2003 | Pan |
| 6,157,541 | A | 12/2000 | Hacke | 6,590,282 B1 | 7/2003 | Wang et al. |
| 6,172,874 | B1 | 1/2001 | Bartilson | 6,600,222 B1 | 7/2003 | Levardo |
| 6,178,093 | B1 | 1/2001 | Bhatt et al. | 6,614,664 B2 | 9/2003 | Lee |
| 6,180,881 | B1 | 1/2001 | Isaak | 6,627,984 B2 | 9/2003 | Bruce et al. |
| 6,187,652 | B1 | 2/2001 | Chou et al. | 6,629,855 B1 | 10/2003 | North et al. |
| 6,205,654 | B1 | 3/2001 | Burns | 6,646,936 B2 | 11/2003 | Hamamatsu et al. |
| 6,208,521 | B1 | 3/2001 | Nakatsuka | 6,660,561 B2 | 12/2003 | Forthun |
| 6,208,546 | B1 | 3/2001 | Ikeda | 6,661,092 B2 | 12/2003 | Shibata et al. |
| 6,214,641 | B1 | 4/2001 | Akram | 6,677,670 B2 | 1/2004 | Kondo |
| 6,215,181 | B1 | 4/2001 | Akram | 6,683,377 B1 | 1/2004 | Shim et al. |
| 6,215,687 | B1 | 4/2001 | Sugano et al. | 6,690,584 B2 | 2/2004 | Uzuka et al. |
| 6,222,737 | B1 | 4/2001 | Ross | 6,699,730 B2 | 3/2004 | Kim et al. |
| 6,222,739 | B1 | 4/2001 | Bhakta et al. | 6,720,652 B2 | 4/2004 | Akram et al. |
| 6,225,688 | B1 | 5/2001 | Kim et al. | 6,721,181 B1 | 4/2004 | Pfeifer et al. |
| 6,232,659 | B1 * | 5/2001 | Clayton ...................... 257/724 | 6,721,185 B2 | 4/2004 | Dong et al. |
| 6,233,650 | B1 | 5/2001 | Johnson et al. | 6,721,226 B2 | 4/2004 | Woo et al. |
| 6,234,820 | B1 | 5/2001 | Perino et al. | 6,744,656 B2 | 6/2004 | Sugano et al. |
| 6,262,476 | B1 | 7/2001 | Vidal | 6,751,113 B2 | 6/2004 | Bhakta et al. |
| 6,262,895 | B1 | 7/2001 | Forthun | 6,756,661 B2 | 6/2004 | Tsuneda et al. |
| 6,265,660 | B1 | 7/2001 | Tandy | 6,760,220 B2 | 7/2004 | Canter et al. |
| 6,266,252 | B1 | 7/2001 | Karabatsos | 6,762,942 B1 | 7/2004 | Smith |
| 6,281,577 | B1 | 8/2001 | Oppermann et al. | 6,768,660 B2 | 7/2004 | Kong et al. |
| 6,288,907 | B1 | 9/2001 | Burns | 6,833,981 B2 | 12/2004 | Suwabe et al. |
| 6,288,924 | B1 | 9/2001 | Sugano et al. | 6,833,984 B1 | 12/2004 | Belgacem |
| 6,300,679 | B1 | 10/2001 | Mukerji et al. | 6,839,266 B1 | 1/2005 | Garrett, Jr. et al. |
| 6,316,825 | B1 | 11/2001 | Park et al. | 6,841,868 B2 | 1/2005 | Akram et al. |
| 6,323,060 | B1 | 11/2001 | Isaak | 6,850,414 B2 | 2/2005 | Benisek et al. |
| 6,336,262 | B1 | 1/2002 | Dalal et al. | 6,873,534 B2 | 3/2005 | Bhakta et al. |
| 6,343,020 | B1 | 1/2002 | Lin et al. | 6,878,571 B2 | 4/2005 | Isaak et al. |
| 6,347,394 | B1 | 2/2002 | Ochoa et al. | 6,884,653 B2 | 4/2005 | Larson |
| 6,349,050 | B1 | 2/2002 | Woo et al. | 6,914,324 B2 | 7/2005 | Rapport et al. |
| 6,351,029 | B1 | 2/2002 | Isaak | 6,919,626 B2 | 7/2005 | Burns |
| 6,357,023 | B1 | 3/2002 | Co et al. | 6,956,284 B2 | 10/2005 | Cady et al. |
| 6,358,772 | B2 | 3/2002 | Miyoshi | 7,053,478 B2 | 5/2006 | Roper et al. |
| 6,360,433 | B1 | 3/2002 | Ross | 7,094,632 B2 | 8/2006 | Cady et al. |
| 6,368,896 | B2 | 4/2002 | Farnworth et al. | 7,154,751 B2 * | 12/2006 | Furuyama et al. ........... 361/704 |
| 6,370,668 | B1 | 4/2002 | Garrett, Jr. et al. | 7,180,167 B2 | 2/2007 | Partridge et al. |
| 6,376,769 | B1 | 4/2002 | Chung | 7,254,036 B2 * | 8/2007 | Pauley et al. ................. 361/721 |
| 6,392,162 | B1 | 5/2002 | Karabatsos | 7,393,226 B2 | 7/2008 | Clayton et al. |
| 6,404,043 | B1 | 6/2002 | Isaak | 7,394,149 B2 | 7/2008 | Clayton et al. |
| 6,410,857 | B1 | 6/2002 | Gonya | 2001/0001085 A1 | 5/2001 | Hassanzadeh et al. |
| 6,426,240 | B2 | 7/2002 | Isaak | 2001/0006252 A1 | 7/2001 | Kim et al. |
| 6,426,549 | B1 | 7/2002 | Isaak | 2001/0013423 A1 | 8/2001 | Dalal et al. |
| 6,426,560 | B1 | 7/2002 | Kawamura et al. | 2001/0015487 A1 | 8/2001 | Forthun |
| 6,428,360 | B2 | 8/2002 | Hassanzadeh et al. | 2001/0026009 A1 | 10/2001 | Tsunesa et al. |
| 6,433,418 | B1 | 8/2002 | Fujisawa et al. | 2001/0028588 A1 | 10/2001 | Yamada et al. |
| 6,444,921 | B1 | 9/2002 | Wang et al. | 2001/0035572 A1 | 11/2001 | Isaak |
| 6,446,158 | B1 | 9/2002 | Karabatsos | 2001/0040793 A1 | 11/2001 | Inaba |
| 6,449,159 | B1 | 9/2002 | Haba | 2001/0052637 A1 | 12/2001 | Akram et al. |
| 6,452,826 | B1 | 9/2002 | Kim et al. | 2002/0001216 A1 | 1/2002 | Sugano et al. |
| 6,459,152 | B1 | 10/2002 | Tomita et al. | 2002/0006032 A1 | 1/2002 | Karabatsos |
| 6,462,412 | B2 | 10/2002 | Kamei et al. | 2002/0030995 A1 | 3/2002 | Shoji |
| 6,465,877 | B1 | 10/2002 | Farnworth et al. | 2002/0076919 A1 | 6/2002 | Peters et al. |
| 6,465,893 | B1 | 10/2002 | Khandros et al. | 2002/0094603 A1 | 7/2002 | Isaak |
| 6,472,735 | B2 | 10/2002 | Isaak | 2002/0101261 A1 | 8/2002 | Karabatsos |
| 6,473,308 | B2 | 10/2002 | Forthun | 2002/0139577 A1 | 10/2002 | Miller |
| 6,486,544 | B1 | 11/2002 | Hashimoto | 2002/0164838 A1 | 11/2002 | Moon et al. |
| 6,489,687 | B1 | 12/2002 | Hashimoto | 2002/0180022 A1 | 12/2002 | Emoto |
| 6,502,161 | B1 | 12/2002 | Perego et al. | 2002/0185731 A1 | 12/2002 | Akram et al. |

| | | | |
|---|---|---|---|
| 2002/0196612 | A1 | 12/2002 | Gall et al. |
| 2003/0002262 | A1 | 1/2003 | Benisek et al. |
| 2003/0026155 | A1 | 2/2003 | Yamagata |
| 2003/0035328 | A1 | 2/2003 | Hamamatsu et al. |
| 2003/0045025 | A1 | 3/2003 | Coyle et al. |
| 2003/0049886 | A1 | 3/2003 | Salmon |
| 2003/0064548 | A1 | 4/2003 | Isaak |
| 2003/0081387 | A1 | 5/2003 | Schulz |
| 2003/0081392 | A1 | 5/2003 | Cady et al. |
| 2003/0089978 | A1 | 5/2003 | Miyamoto et al. |
| 2003/0090879 | A1 | 5/2003 | Doblar et al. |
| 2003/0096497 | A1 | 5/2003 | Moore et al. |
| 2003/0109078 | A1 | 6/2003 | Takahashi et al. |
| 2003/0116835 | A1* | 6/2003 | Miyamoto et al. .......... 257/678 |
| 2003/0159278 | A1 | 8/2003 | Peddle |
| 2003/0168725 | A1 | 9/2003 | Warner et al. |
| 2004/0000708 | A1 | 1/2004 | Rapport et al. |
| 2004/0012991 | A1 | 1/2004 | Kozaru |
| 2004/0021211 | A1 | 2/2004 | Damberg |
| 2004/0099938 | A1 | 5/2004 | Kang et al. |
| 2004/0150107 | A1 | 8/2004 | Cha et al. |
| 2004/0229402 | A1 | 11/2004 | Cady et al. |
| 2004/0236877 | A1 | 11/2004 | Burton |
| 2005/0082663 | A1 | 4/2005 | Wakiyama et al. |
| 2005/0108468 | A1 | 5/2005 | Hazelzet et al. |
| 2005/0133897 | A1 | 6/2005 | Baek et al. |
| 2005/0242423 | A1 | 11/2005 | Partridge et al. |
| 2005/0263911 | A1 | 12/2005 | Igarashi et al. |
| 2006/0020740 | A1 | 1/2006 | Bartley et al. |
| 2006/0043581 | A1* | 3/2006 | Prokofiev ................... 257/713 |
| 2006/0050496 | A1 | 3/2006 | Goodwin |
| 2006/0050497 | A1 | 3/2006 | Goodwin |
| 2006/0053345 | A1 | 3/2006 | Goodwin |
| 2006/0083043 | A1* | 4/2006 | Cypher ........................ 365/51 |
| 2006/0091529 | A1 | 5/2006 | Wehrly et al. |
| 2006/0095592 | A1 | 5/2006 | Borkenhagen |
| 2006/0111866 | A1 | 5/2006 | LeClerg et al. |
| 2006/0125067 | A1 | 6/2006 | Wehrly et al. |
| 2007/0211426 | A1 | 9/2007 | Clayton et al. |
| 2007/0211711 | A1 | 9/2007 | Clayton |
| 2007/0212906 | A1 | 9/2007 | Clayton et al. |
| 2007/0212920 | A1 | 9/2007 | Clayton et al. |
| 2008/0192428 | A1 | 8/2008 | Clayton et al. |

FOREIGN PATENT DOCUMENTS

| | | |
|---|---|---|
| EP | 0 298 211 A3 | 1/1989 |
| EP | 1 119049 A2 | 7/2001 |
| GB | 2 130 025 A | 5/1984 |
| JP | 53-85159 | 7/1978 |
| JP | 58-96756 (A) | 6/1983 |
| JP | 3-102862 | 4/1991 |
| JP | 5-29534 (A) | 2/1993 |
| JP | 5-335695 (A) | 12/1993 |
| JP | 2821315 (B2) | 11/1998 |
| JP | 2001/077294 (A) | 3/2001 |
| JP | 2001/085592 (A) | 3/2001 |
| JP | 2001/332683 (A) | 11/2001 |
| JP | 2002/009231 (A) | 1/2002 |
| JP | 2003/037246 (A) | 2/2003 |
| JP | 2003/086760 (A) | 3/2003 |
| JP | 2003/086761 (A) | 3/2003 |
| JP | 2003/309246 (A) | 10/2003 |
| JP | 2003/347503 (A) | 12/2003 |
| WO | WO03/037053 | 5/2003 |
| WO | WO 03/037053 A1 | 5/2003 |
| WO | WO 2004/109802 A1 | 12/2004 |

OTHER PUBLICATIONS

Complaint filed Mar. 8, 2007, in the United States District Court for the District of Massachusetts, Boston Division, Civil Action No. 07 CA 10468 DPW.

Letter dated Sep. 11, 2006, from Chris Karabatsos of Kentron Technologies to John Kelly, President of JEDEC Solid State Technology Association, concerning potential interferences involving U.S. Appl. No. 11/306,806.

Pages 19-22 of Presentation by Netlist, Aug. 2004.

Flexible Printed Circuit Technology—A Versatile Interconnection Option. (Website 2 pages) Fjelstad, Joseph. Dec. 3, 2002.

Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.

Tessera uZ Ball Stack Package. 4 figures that purport to be directed to the uZ-Ball Stacked Memory, Published on the Internet.

Chip Scale Review Online—An Independent Journal Dedicated to the Advancement of Chip-Scale Electronics. (Webiste 9 pages) Fjelstad, Joseph, Pacific Consultants L.LC., Published Jan. 2001 on Internet.

Flexible Thinking: Examining the Flexible Circuit Tapes. (Website 2 pages) Fjelstad, Joseph., Published Apr. 20, 2000 on Internet.

Ron Bauer, Intel. "Stacked-CSP Delivers Flexibility, Reliability, and Space-Saving Capabilities", vol. 3, Spring 2002. Published on the Internet.

Tessera Technologies, Inc.—Semiconductor Intellectual Property, Chip Scale Packaging-Website pages (3), Internet.

Tessera Introduces uZ ä-Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ ä-Ball Stacked Memory Package. Published Jul. 17, 2002 in San Jose, CA.

William R. Newberry, Design Techniques for Ball Grid Arrays, Xynetix Design Systems, Inc., Portland, Maine, Published on the Internet.

Chip Scale Packaging and Redistribution, Paul A. Magill, Glenn A. Rinne, J. Daniel Mis, Wayne C. Machon, Joseph W. Baggs, Unitive Electronics Inc.

Dense-Pac Microsystems, 16 Megabit High Speed CMOS SRAM DPS1MX16MKn3.

Dense-Pac Microsystems, 256 Megabyte CMOS DRAM DP3ED32MS72RW5.

Dense-Pac Microsystems, Breaking Space Barriers, 3-D Technology 1993.

Dense-Pac Microsystems, DPS512X16A3, Ceramic 512K X 16 CMOS SRAM Module.

IBM Preliminary 168 Pin SDRAM Registered DIMM Functional Description & Timing Diagrams.

3D Interconnection for Ultra-Dense Multichip Modules, Christian Val, Thomson-CSF DCS Computer Division, Thierry Lemoine, Thomson-CSF RCM Radar Countermeasures Division.

High Density Memory Packaging Technology High Speed Imaging Applications, Dean Frew, Texas Instruments Incorporated.

Vertically-Intergrated Package, Alvin Weinberg, Pacesetter, Inc. and W. Kinzy Jones, Florida International University.

Search Report for GB Application No. GB0516622.8, May 25, 2006.

PCT/US05/28547 International Search Report, PCT, Aug. 18, 2006.

PCT/US05/28547 International Search Report and Written Opinion, PCT, Aug. 18, 2006.

PCT/US05/28547 Notification Concerning Transmittal of International Preliminary Report on Patentability, Mar. 15, 2007.

GB 0516622.8 Search Report, May 25, 2006.

PCT/US06/04690 International Search Report, PCT, Feb. 16, 2007.

PCT/US06/38720 International Search Report and Written Opinion, PCT, Apr. 5, 2007.

PCT/US2006/007193, International Search Report and Written Opinion of the International Searching Authority, PCT, Nov. 7, 2007.

* cited by examiner

MODULE THERMAL MANAGEMENT SYSTEM AND METHOD

RELATED APPLICATIONS

This application is a continuation-in-part of U.S. patent application Ser. No. 11/068,688 now U.S. Pat. No. 7,324,352, filed Mar. 1, 2005 and a continuation-in-part of U.S. patent application Ser. No. 11/005,992 now U.S. Pat. No. 7,480,152, filed Dec. 7, 2004 both of which are hereby incorporated by reference herein. U.S. patent application Ser. No. 11/068,688 is a continuation-in-part of U.S. patent application Ser. No. 11/007,551 now U.S. Pat. No. 7,511,968, filed Dec. 8, 2004 which application is hereby incorporated by reference and is a continuation-in-part of U.S. patent application Ser. No. 10/934,027, filed Sep. 3, 2004 which application is hereby incorporated by reference herein.

FIELD

The present invention relates to systems and methods for thermal management of high density circuit modules.

BACKGROUND

The well-known DIMM (dual in-line memory module) board has been used for years, in various forms, to provide memory expansion. A typical DIMM includes a conventional PCB (printed circuit board) with memory devices and supporting digital logic devices mounted on both sides. The DIMM is typically mounted in the host computer system by inserting a contact-bearing edge of the DIMM into a card edge connector. Systems that employ DIMMs and other similar modules provide, however, very limited profile space for such devices. The limited profile space available has exacerbated the already rising thermal energy loading demands precipitated by increasing speeds and capacities of both memory and logic.

Circuit modules and, in particular, memory modules are configured in a variety of ways, both dimensionally and electrically. A few examples include, registered DIMMs, fully buffered DIMMs (FB-DIMM), SO-DIMMS, PCI DIMMS, or graphics modules that are similar to DIMMs and have on-board memory and graphics engines. Some of these variations can be combined. For example, a SO-DIMM can be configured in a fully buffered mode.

Typical module construction is premised on a circuit board substrate typically devised of the well-known FR4 or similar materials. "FR" means flame retardant and type "4" means woven glass reinforced epoxy resin. Such substrates are a staple of the electronics industry but fall somewhat short of the demands imposed by contemporary applications.

For example, when a DIMM is inserted in the edge connector socket in which they are typically employed in a wide variety of applications, the pressure employed for the insertion can sometimes flex the board and cause cracking of the on-board ICs or separation or reduced reliability for the joints between the ICs and the circuitry embedded in the board. Further, FR4 typically exhibits a low thermal conductivity, thus inducing heat accumulation in modules.

What is needed therefore, is a new method and system for management of thermal loading of modules.

SUMMARY

A circuit module is provided that shunts thermal energy into the chassis or a part of the box of the application in which the module is employed. In a preferred mode, a flex circuit is populated with plural ICs which are, preferably, array type (CSP) devices. Insertion contacts are disposed along the flex circuit. A substrate with first and second lateral sides provides a form for the module. That substrate is preferably comprised of metallic material and exhibits an edge about which the flex circuit is wrapped. The substrate is thermally connected to a chassis component either directly or through a thermal conduit such as a thermally conductive compliant material or spring in thermal contact with the chassis component. Other embodiments employ more traditional construction techniques that may or mat not be supplemented with metallic layers for thermal conduction. Still other embodiments may employ substrates that are composed in part of traditional materials such as FR4. The invention may be employed with a variety of modules of many different types and constructions and may be readily employed in a wide variety of applications.

DETAILED DESCRIPTION OF PREFERRED EMBODIMENTS

Figure 1:
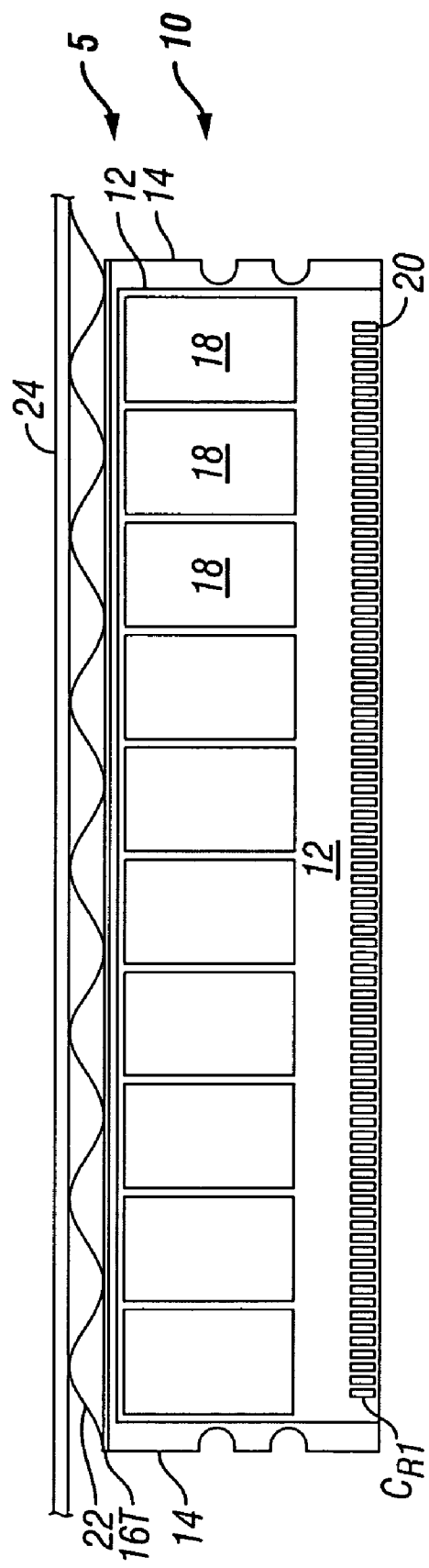
FIG. 1 depicts a preferred embodiment in accordance with the present invention.

FIG. 1 depicts a preferred embodiment of a module 10 in accordance with the present invention. In depicted module 10, a flex circuit 12 wrapped about an edge of a substrate 14 to dispose ICs 18 on either side of substrate 14 and dispose a set of contacts 20 (insertion contacts, edge socket contacts, socket contacts, for example) for insertion into an edge connector socket.

Module 10 is depicted as being in thermal connection with thermal conduit 24 through thermal conduit 22. Thermal conduit 22 participates in the thermal connection between substrate 14 and chassis 24. Thermal conduit 22 may be any material that allows thermal energy to flow between module 10 and chassis or box 24. Preferably, thermal conduit 22 is comprised of a material that provides some compliance and resilience to compression. This increases the reliability of the thermal path between module 10 and chassis 24 while reducing the possibility of damaging physical forces upon module 10. As shown, thermal conduit 22 is, at least in part, between substrate 14 and chassis component 24.

In the depiction of FIG. 1, thermal conduit 22 is a spring but, as those of skill will recognize upon appreciation of this disclosure, thermal conduit 22 may be any of a variety of thermally conductive materials and thermal conduit 22 need not be compliant. In some embodiments, the system of the invention may even realize contact between substrate 14 of module 10 and chassis 24 without an intermediate thermal conduit. Those of skill will recognize, however, the preference for a compliant intermediary element as a thermal conduit 22. Some examples of appropriate thermal conduit materials include springs, electromagnetic radiation gaskets, thermally conductive materials from the Bergquist company or other suppliers of thermally conductive materials.

In a preferred mode, substrate 14 and its optional, but preferred, extension 16T of module 10 are comprised of metallic material such as, for example, copper, aluminum, or metallic alloys. The use of metallic materials for substrate 14 has additional advantages such as enhanced strength as well as thermal management advantages. Those of skill will recognize that extension 16T is preferably, but need not be of a contiguous piece with substrate 14 and may, consequently, be considered a part of substrate 14 in either case. As shown in later cross-sectional views, at least some of the ICs are in thermal communication with substrate 14 and, consequently, can shed thermal energy directly into substrate 14. Other of the resident ICs of module 10 can shed thermal energy into flex 12 which, as those of skill will recognize, may be constructed to enhance thermal conduction into substrate 14.

Figure 2:
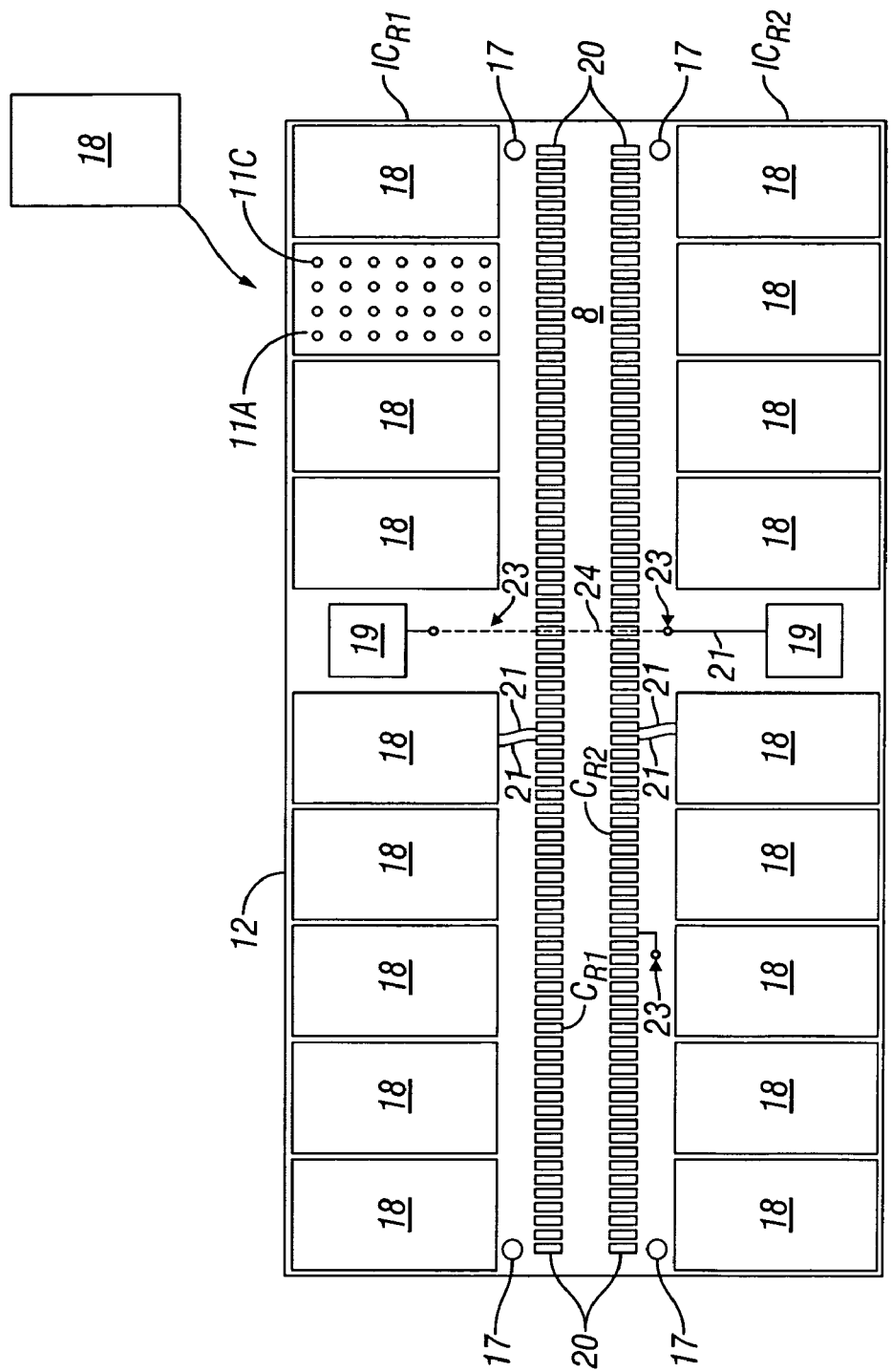
FIG. 2 depicts a first side of a flex circuit devised in accordance with the present invention.
Figure 3:
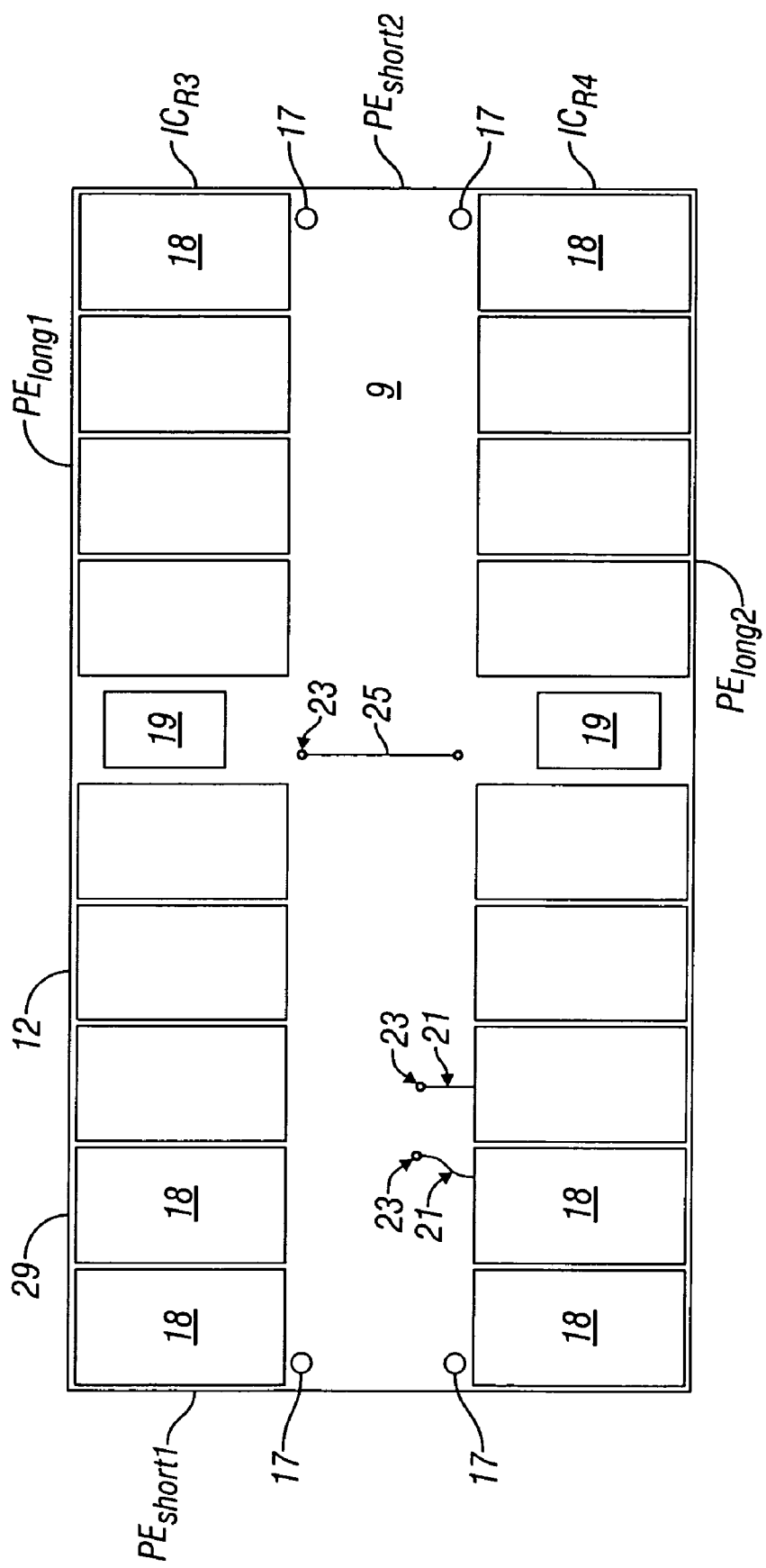
FIG. 3 depicts the second side of the exemplar populated flex circuit of FIG. 2.

FIGS. 2 and 3 depict opposing sides 8 and 9 of a preferred flex circuit 12 ("flex", "flex circuitry", "flexible circuit") used in constructing a preferred embodiment of a module 10 in accordance with the present invention. Flex circuit 12 is preferably made from conductive layers supported by one or more flexible substrate layers. The construction of flex circuitry is known in the art. The entirety of the flex circuit 12 may be flexible or, as those of skill in the art will recognize, the flexible circuit structure 12 may be made flexible in certain areas to allow conformability to required shapes or bends, and rigid in other areas to provide rigid and planar mounting surfaces. Preferred flex circuit 12 has openings 17 for use in aligning flex circuit 12 to substrate 14 during assembly.

ICs 18 on flexible circuit 12 are, in this embodiment, chip-scale packaged memory devices. For purposes of this disclosure, the term chip-scale or "CSP" shall refer to integrated circuitry of any function with an array package providing connection to one or more die through contacts (often embodied as "bumps" or "balls" for example) distributed across a major surface of the package or die. CSP does not refer to leaded devices that provide connection to an integrated circuit within the package through leads emergent from at least one side of the periphery of the package such as, for example, a TSOP.

The present invention may be employed with leaded or CSP devices or other devices in both packaged and unpackaged forms but where the term CSP is used, the above definition for CSP should be adopted. Consequently, although CSP excludes leaded devices, references to CSP are to be broadly construed to include the large variety of array devices (and not to be limited to memory only) and whether die-sized or other size such as BGA and micro BGA as well as flip-chip. As those of skill will understand after appreciating this disclosure, some embodiments of the present invention may be devised to employ stacks of ICs each disposed where an IC 18 is indicated in the exemplar Figs.

Multiple integrated circuit die may be included in a package depicted as a single IC 18. While in this embodiment memory ICs are used to provide a memory expansion board, this is not limiting and various embodiments may include a variety of integrated circuits and other components. Such variety may include microprocessors, FPGA's, RF transceiver circuitry, digital logic, as a list of non-limiting examples, or other circuits or systems which may benefit from a high-density circuit board capability.

FIG. 2 depicts a top or outer side 8 of flex circuit 12 having ICs 18 mounted in two rows $IC_{R1}$ and $IC_{R2}$. Contact arrays are disposed beneath ICs 18 and circuit 19 to provide conductive pads for interconnection to the ICs. An exemplar contact array 11A is shown as is exemplar IC 18 to be mounted at contact array 11A as depicted. The contact arrays 11A that correspond to an IC row (e.g., $IC_{R1}$) may be considered a contact array set. In the depicted embodiment, between the rows $IC_{R1}$ and $IC_{R2}$ of ICs 18, flex circuit 12 has two rows ($C_{R1}$ and $C_{R2}$) of module contacts 20. Contacts 20 may be disposed in arrangements other than rows, but a row arrangement corresponds to the typical edge connector with which a preferred embodiment is typically, but not always, employed. Further, contacts 20 are, in some embodiments, disposed in locations other than between ICs.

When flex circuit 12 is folded about the edge of substrate 14 as later depicted, side 8 depicted in FIG. 2 is presented at the outside of module 10. The opposing side 9 of flex circuit 12 (FIG. 3) is on the inside in the exemplar configurations depicted in FIGS. 4 and 5, for example.

The depiction of FIG. 2 shows two pluralities of ICs 18 along side 8 of flex circuit 12, the pluralities or sets of ICs being referenced in FIG. 2 as $IC_{R1}$ and $IC_{R2}$. Other embodiments may have other numbers of rows and there may be only one such row. FIG. 3 depicts another two pluralities of ICs 18 along side 9 of flex circuit 12 referenced as $IC_{R3}$ and $IC_{R4}$. Various discrete components such as termination resistors, bypass capacitors, and bias resistors may also be mounted on each of sides 8 and 9 of flex 12. Such discrete components are not shown to simplify the drawing. Flex circuit 12 may also depicted with reference to its perimeter edges, two of which are typically long ($PE_{long1}$ and $PE_{long2}$) and two of which are typically shorter ($PE_{short1}$ and $PE_{short2}$). Other embodiments may employ flex circuits 12 that are not rectangular in shape and may be square in which case the perimeter edges would be of equal size or other convenient shape to adapt to manufacturing particulars. However, rectangular shapes for flex circuit 12 assist in providing a low profile for a preferred module devised with use of flex circuit 12. FIG. 2 depicts exemplar conductive traces 21 connecting rows $C_{R1}$ and $C_{R2}$ of module contacts 20 to ICs 18. Only a few exemplar traces are shown to simplify the drawing. Traces 21 may also connect to vias that may transit to other conductive layers of flex 12 in certain embodiments having more than one conductive layer. Shown is a via 23 connecting a signal trace 21 from circuit 19 to a trace 25 disposed on another conductive layer of flex 12 as illustrated by the dotted line of trace 25. In a preferred embodiment, vias connect ICs 18 on side 9 of flex 12 (FIG. 3) to module contacts 20. Traces 21 and 25 may make other connections between the ICs on either side of flex 12 and may traverse the rows of module contacts 20 to interconnect ICs. Together the various traces and vias make interconnections needed to convey data and control signals to the various ICs. Those of skill will understand that the present invention may be implemented with only a single row of module contacts 20 and may, in other embodiments, be implemented as a module bearing ICs on only one side.

Contact arrays such as array 11A are disposed beneath ICs 18 and IC 19. IC 19 depicted between ICs 18 may be a buffer or controller, for example, and in a preferred embodiment it may be the well known advanced memory buffer or "AMB" although it can be a circuit of a variety of types. Consequently, the module as depicted is typically populated with ICs of a first type (e.g., memory 18) and at least one IC of a second type such as IC 19. In preferred modes, side 9 of flex circuit 12 will be populated with a plurality of CSPs of a first type and at least one CSP of a second type.

Figure 4:
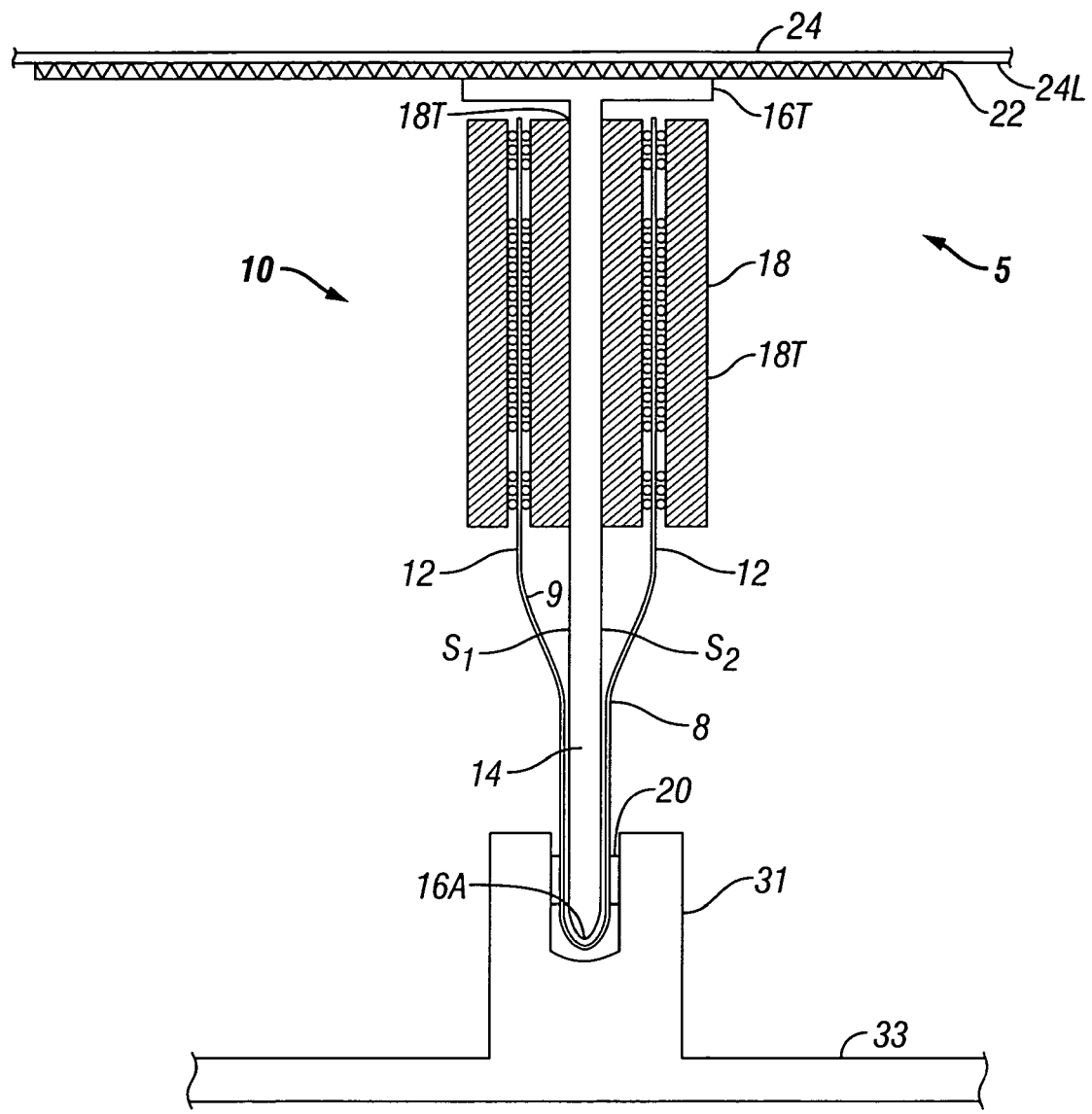
FIG. 4 depicts a cross-section of an embodiment in accordance with the invention.

FIG. 4 is a cross-section view of a system 5 devised in accordance with the present invention. The depicted system 5 comprises a module 10 and a chassis component 24 into which thermal energy from module 10 is shunted to chassis component 24 through substrate 14 of module 10 and, in the depicted embodiment, thermal conduit 22 that participates in the thermal connection between substrate 14 and chassis component or box 24. Chassis component 24 is a part of a computing system and may be, for example, a shelf or extension of a larger chassis or box of a computer system such as a general purpose PC. As another example, it may be a part of a server or larger computer chassis or box or it may be a metallic extension, sheet, or bracket connected to a chassis structure in a smaller computing application such as, for example, a notebook computer or a mobile field computer or computing platform of specialized application.

The cross-sectional view of FIG. 4 is taken through ICs 18 of module 10 which are disposed in the depicted embodiment on either side of sides S1 and S2 of substrate 14 of module 10. In the depicted system 5, module 10 is shown inserted into edge connector 31 that is resident on board 33. Edge connector 31 is familiar to those of skill in the art and, as shown, it is typically employed on a board such as a motherboard in a computer. As those of skill will recognize, there is some inherent but minor thermal energy flow between module 10 and board 33 through edge connector 31 but such practitioners should also recognize that such thermal energy flow through edge connector 31 is not the thermal connection referred to in the present application.

Substrate 14 makes contact with thermal conduit 22 through extension 16T. Thermal conduit 22 is a gasket like material in this depiction and is disposed along the lower side 24L of chassis component 24. The gasket material of the particular thermal conduit 22 shown in this FIG. 4, may be, as an example, an electromagnetic radiation gasket material for example.

Upper surface $18_T$ of at least some of ICs 18 are employed in the depiction of FIG. 4 to attach the IC-populated flex circuit 12 to substrate 14 of module 10. Preferably, thermal glues or adhesives are used for such attachment. Substrate or support structure 14 has a first perimeter edge identified as 16A and a second limit depicted in the depiction of FIG. 4 as extension 16T and those of skill will recognize that extension 16T can be devised in a variety of shapes or substrate 14 may have merely a conformal second edge with no special extension or shaping features.

When at least one and preferably more of the upper surfaces $18_T$ of those CSPs are adhered to substrate 14, the preferred metallic material of substrate 14 encourages extraction of thermal energy from the CSPs that operate in conjunction in the module. Flex circuit 12 may be particularly devised to operate as a heat spreader or sink adding to the thermal conduction out of ICs 18 and 19. In another embodiment, advantageous features from multiple technologies may be combined with use of FR4 having a layer of copper on both sides to provide a substrate 14 devised from familiar materials which may provide heat conduction to thermal conduit 22 or chassis 24. Other embodiments may combine in a module 10, traditional construction materials such as FR4 with metallic materials in a substrate to take better advantage of the benefits of the present invention but still employ traditional connective strategies.

While contacts 20 may be seen as protruding from the surface of flex circuit 12, other embodiments of module 10 in accordance with the invention, may have flush contacts or contacts below the surface level of flex 12. Substrate 14 supports contacts 20 from behind flex circuit 12 in a manner devised to provide the mechanical form required for insertion into a socket. In other embodiments, the thickness or shape of substrate 14 in the vicinity of perimeter edge 16A of substrate 14 may vary.

Substrate or support structure 14 of module 10 typically has first and second lateral sides $S_1$ and $S_2$. As shown, in some preferred embodiments, flex circuitry 12 is wrapped about perimeter edge 16A of substrate 14 to dispose contacts CR1 and CR2 proximal to edge 16A of substrate 14. Other embodiments need not exhibit a flex circuit 12 wrapped about an edge of substrate 14 but may have separate flex circuits on each of sides S1 and S2 of substrate 14. Although there are construction advantages in the use of one flex circuit to devise a module 10, certainly the advantages of the invention may be employed when a separate flex is used on one or each of both sides of substrate 14 to connect pluralities of ICs on one or both sides of substrate 14 to contacts 20 in a module 10 as may be employed in the invention. Further, other embodiments may even employ connectors and boards, an example of which configuration is shown in FIG. 5.

Figure 5:
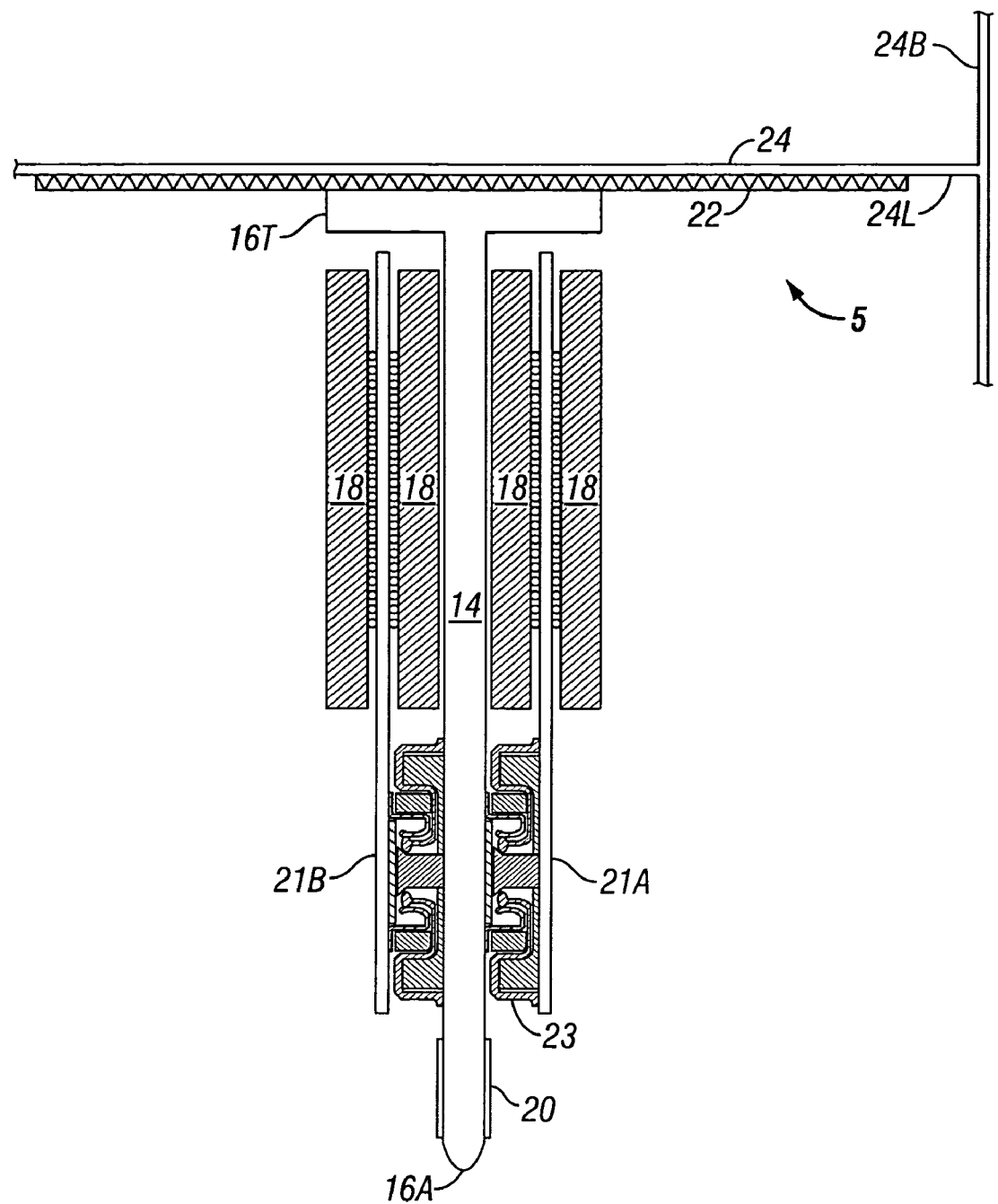
FIG. 5 is a cross-sectional depiction of an other embodiment of a module in accordance with the invention.

FIG. 5 depicts a system 5 that employs a module 10 with secondary substrates 21A and 21B. Such secondary substrates are populated in the depiction with ICs 18 and may be comprised of PCB materials although other materials known in the art may be employed. For example, secondary substrate 21 may be provided by the rigid portion of an integrated rigid flex structure that provides mounting fields for ICs 18, ICs 19 and other circuitry such as registers and PLLs for example and a flexible portion that transits about primary substrate 14 or extends, for example, to flex edge connectors mounted on primary substrate 14. In depicted embodiment, secondary substrates 21A and 21B are connected to connectors 23 which are connected to contacts 20 as will be understood by those of skill in the art with techniques such as flex or layered connectives or even portions of traditional circuit board substrate. Module 10 of system 5 of FIG. 5 is shown in thermal connection with thermal conduit 22 along underside 24L of chassis component 24 which is a shelf extension of larger chassis body 24B.

Figure 6:
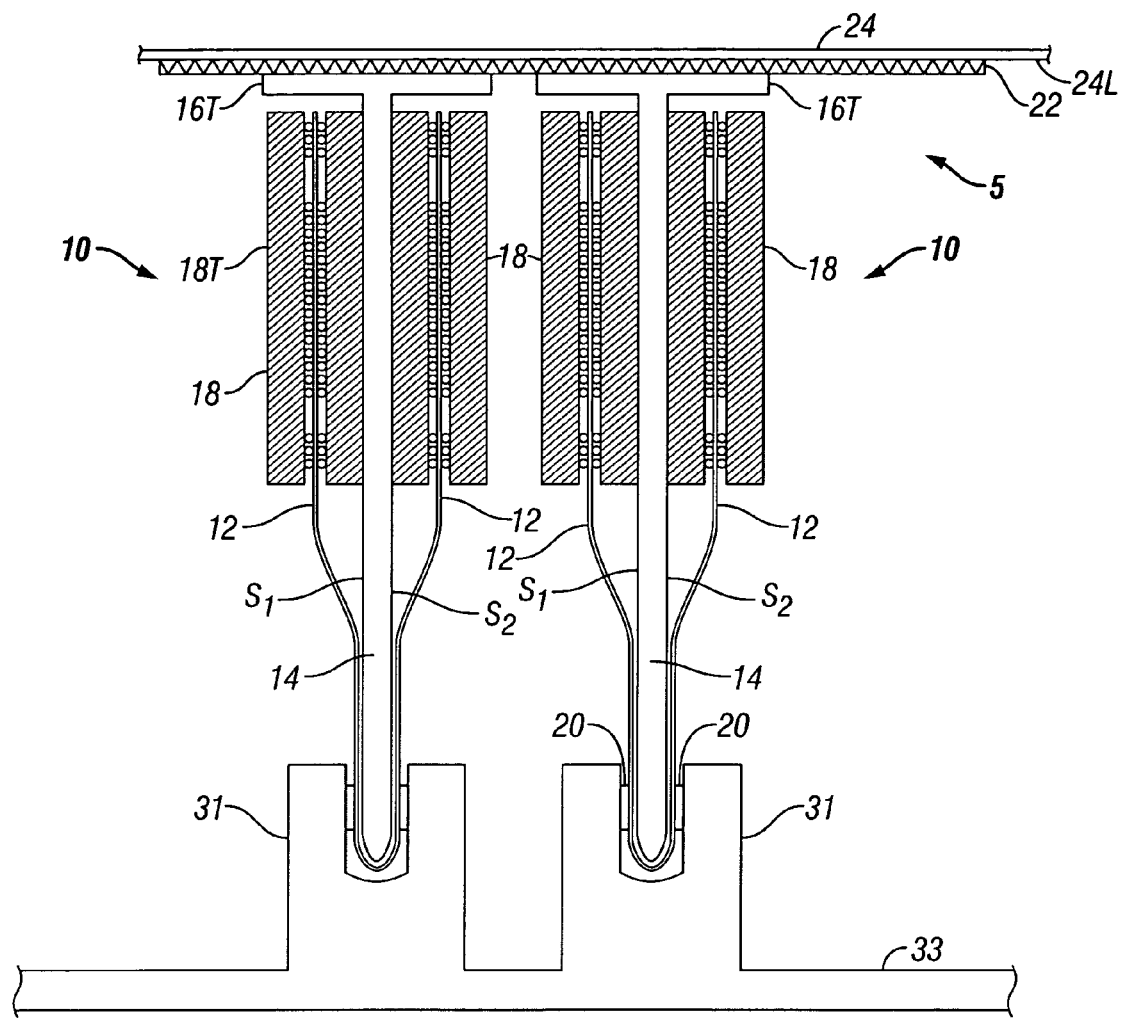
FIG. 6 is a cross sectional view of a pair of modules in use in a computer application in accordance with an embodiment of the invention.

FIG. 6 depicts an embodiment of system 5 that employs two modules 10 to illustrate the use of multiple modules 10 in a system 5 in accordance with the invention. Each of substrates 14 of the depicted modules 10 are in thermal connection with thermal conduit 22 through their respective extensions 16T.

Figure 7:
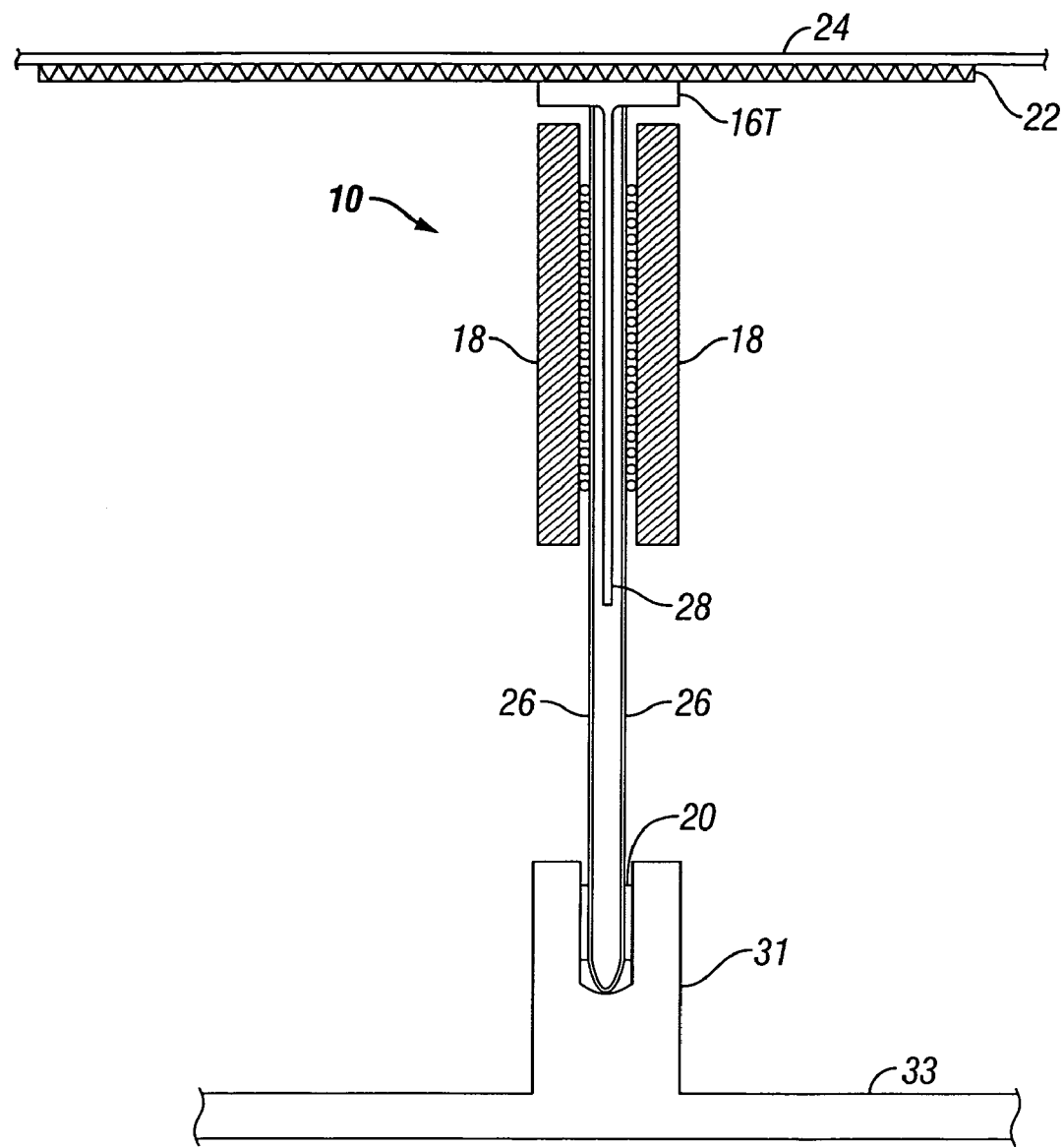
FIG. 7 depicts another cross-sectional view of a module devised in accordance with the present invention.

FIG. 7 depicts another embodiment of system 5 that includes a module 10 that employs fewer ICs 18. In the depicted module 10, substrate 14 is made of FR4 but has a copper core includes copper layers 26 and a core 28 that cooperates with extension 16T to shunt thermal energy to chassis or box 24. Such a depiction is not meant to be literal but is offered to help those of skill understand that a large variety of construction combinations for modules that can employ the principles of the invention to advantage.

Figure 8:
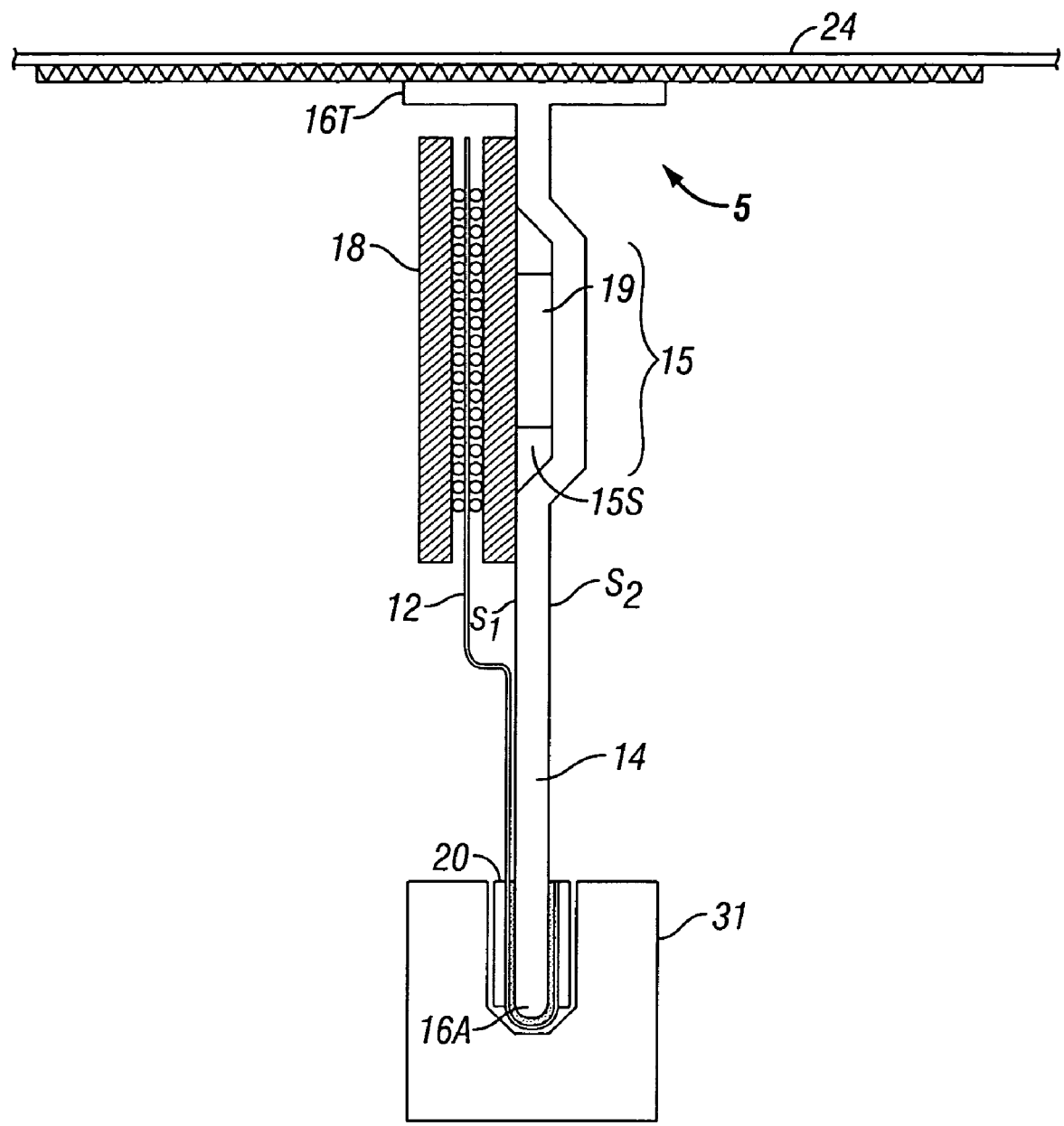
FIG. 8 depicts another preferred embodiment in accordance with the present invention.

FIG. 8 depicts a cross-sectional view of another embodiment of a system 5 that employs a module 10 inserted into a card edge connector. Module 10 employs an IC 19 and has a deformation, contour, or dimple 15 that creates space 15S which is accommodative of IC 19 which may be, in the depicted embodiment of module 10 a device of taller profile such as, for example, a buffer such as an AMB for example in a fully-buffered DIMM or a graphics engine in a graphics module. Substrate 14 need not be of uniform thickness as shown in a variety of the US patent applications incorporated by reference herein all of which are owned by Staktek Group L.P., the assignee of the present application. Substrate 14 of module 10 of FIG. 8 is in contact with thermal conduit 22 through extension 16T and thermal conduit 22 is shown in contact with chassis or box component 24.

Figure 9:
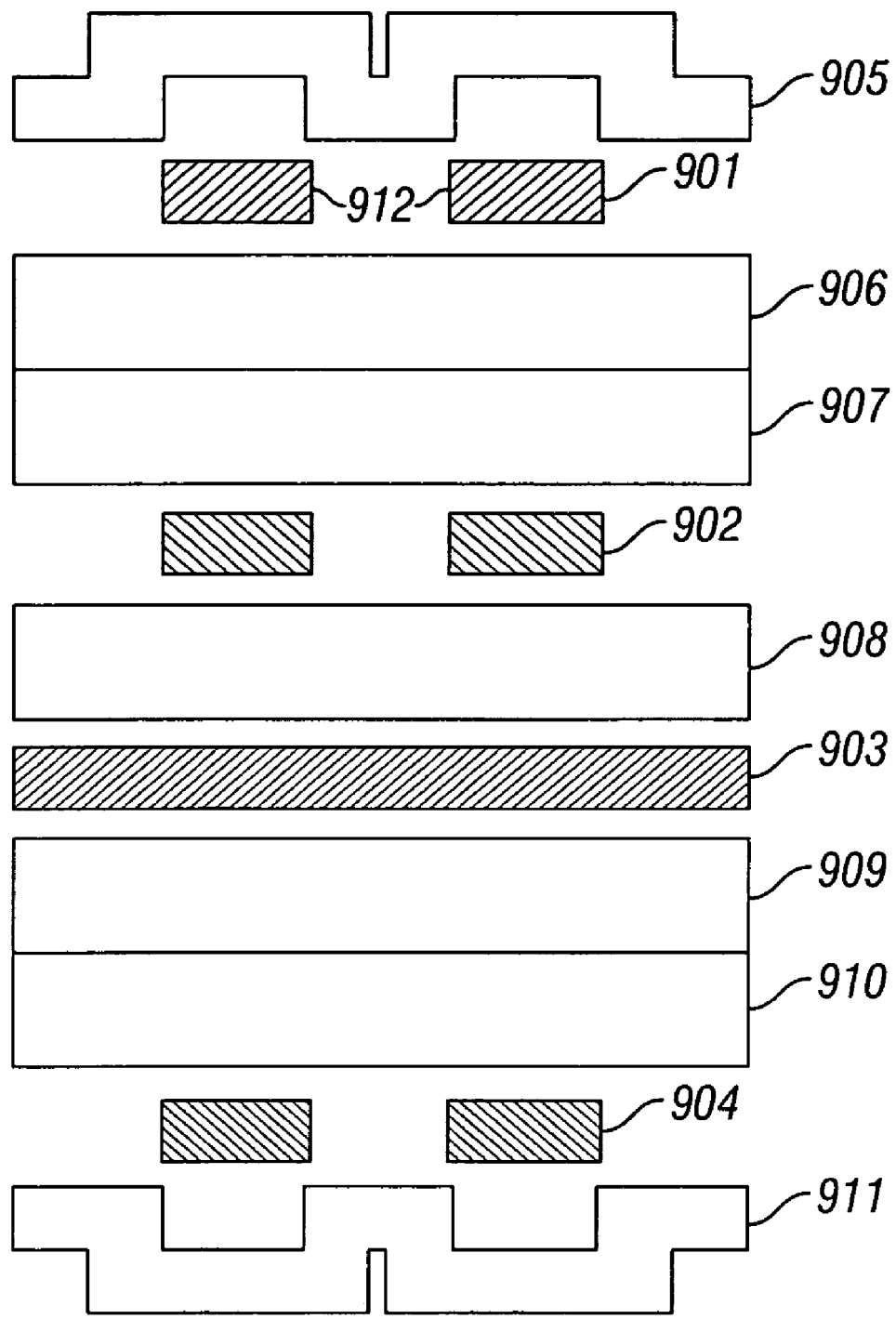
FIG. 9 depicts an exploded view of a flex circuit employed in a preferred embodiment of a module in accordance with the present invention.

FIG. 9 depicts an exploded cross-sectional view of a flex circuit 12 that may be employed with some preferred embodiments of modules in accordance with the present invention. The depicted flex circuit 12 has four conductive layers 901-904 and seven insulative layers 905-911. The numbers of layers described are merely those of one preferred embodiment and other numbers and layer arrangements may be employed.

Top conductive layer 901 and the other conductive layers are preferably made of a conductive metal such as, for example, copper or alloy 110. In this arrangement, conductive layers 901, 902, and 904 express signal traces 912 that make various connections on flex circuit 12. These layers may also express conductive planes for ground, power, and reference voltages. For example, top conductive layer 901 may also be provided with a flood, or plane to provide the VDD to ICs mounted to flex circuit 12.

In this embodiment, inner conductive layer 902 expresses traces connecting to and among the various devices mounted along the sides of flex circuit 12. The function of any of the depicted conductive layers may, of course, be interchanged with others of the conductive layers. Inner conductive layer 903 expresses a ground plane, which may be split to provide VDD return for pre-register address signals in designs that employ such registers. Inner conductive layer 903 may further express other planes and traces. In this embodiment, floods or planes at bottom conductive layer 904 provides VREF and ground in addition to the depicted traces.

Insulative layers 905 and 911 are, in this embodiment, dielectric solder mask layers which may be deposited on the adjacent conductive layers. Insulative layers 907 and 909 are made of adhesive dielectric. Other embodiments may not have such adhesive dielectric layers. Insulative layers 906, 908, and 910 are preferably flexible dielectric substrate materials made of polyimide. Any other suitable flexible circuit substrate material may be used.

One advantageous methodology for efficiently assembling a circuit module 10 such as described and depicted herein is as follows. In a preferred method of assembling a preferred module assembly 10, flex circuit 12 is placed flat and both sides populated according to circuit board assembly techniques known in the art. Flex circuit 12 is then folded about end 16A of substrate 14. Flex 12 may be laminated or otherwise attached to substrate 14 through, for example, upper surfaces 18$_T$ of ICs 18. The present invention may be employed to advantage in a variety of applications and environment such as, for example, in computers such as servers and notebook computers by being placed in motherboard expansion slots to provide enhanced memory capacity while utilizing fewer sockets or where minimal profiles are of value and thermal management is a constraint of concern.

Although the present invention has been described in detail, it will be apparent to those skilled in the art that many embodiments taking a variety of specific forms and reflecting changes, substitutions and alterations can be made without departing from the spirit and scope of the invention. Just as one example, the principles of the present invention may be employed where only one IC 18 is resident on a side of a flex circuit 12 or where multiple ranks or pluralities of ICs are resident on a side of flex circuit 12, or where multiple ICs 18 are stacked and therefore disposed one atop the other to give a single module 10 materially greater capacity.

Therefore, the described embodiments illustrate but do not restrict the scope of the claims.

The invention claimed is:

1. A system for extraction of thermal energy from a circuit module, the system comprising:
    a circuit module comprised of a flex circuit having a first side and a second side opposite to the first side, the first side of said flex circuit having edge connector contacts and each of the first side and the second side being mounted with plural ICs;
    a single rigid substrate supporting the module and having a bottom edge about which is disposed the flex circuit so as to place the plural ICs mounted on the second side of the flex circuit between the flex circuit and the rigid substrate and the edge connector contacts of the first side of the flex circuit proximal to the bottom edge but facing outward away from the substrate, the rigid substrate being comprised of metallic material, and disposed opposite said bottom edge there being a thermally conductive extension of the rigid substrate substantially perpendicular to the single rigid substrate,
    a chassis component of a computer system with which the thermally conductive extension is in contact to provide a path for thermal energy from the circuit module to the chassis component, the chassis component being a part of a box within which the circuit module is disposed.

2. The system of claim 1 further comprising a thermal conduit disposed at least in part between the chassis component and the thermally conductive extension of the substrate.

3. The system of claim 1 in which the rigid substrate is comprised of aluminum.

4. The system of claim 1 in which the rigid substrate is comprised of copper.

5. The thermal management system of claim 1 in which the circuit module is a memory module that expresses at least one fully-buffered DIMM instantiation.

6. The thermal management system of claim 1 in which the circuit module is a memory module that expresses at least one registered DIMM instantiation.

7. The thermal management system of claim 1 in which the circuit module is a graphics module including plural CSPs and a graphics processor.

8. The thermal management system of claim 2 in which the thermal conduit is comprised of an electromagnetic gasket material.

9. The system of claim 2 in which the thermal conduit is comprised of a compliant thermally conductive material.

10. The system of claim 9 in which the compliant thermally conductive material is comprised of an electromagnetic gasket material.

11. The system of claim 9 in which the compliant thermally conductive material is comprised of a spring.

12. A system for extraction of thermal energy from a circuit module, the system comprising:
    a circuit module comprised of a flex circuit having a first side and a second side opposite to the first side, the first side of said flex circuit having edge connector contacts and at least one of the first side and the second side being mounted with plural ICs;
    a single rigid substrate supporting the module and comprised of metallic material, the rigid substrate being configured with a bottom edge and there being a thermally conductive extension perpendicularly connected to the rigid substrate, the flex circuit being wrapped about the bottom edge of the substrate so as to dispose the edge connector contacts of the flex circuit facing outward away from the rigid substrate but proximal to the bottom edge of the substrate; and a chassis component of a computer system with which the thermally conductive extension is in contact to provide a path for thermal energy from the circuit module to the chassis component.

13. The system of claim 12 further comprising a thermal conduit disposed at least in part between the chassis component and the substrate.

14. The system of claim 12 in which the substrate is comprised of aluminum.

15. The system of claim 12 in which the substrate is comprised of copper.

16. The system of claim 12 in which the circuit module expresses a DIMM.

17. The system of claim 12 in which the circuit module is a graphics module including a graphics processor.

18. The system of claim 13 in which the thermal conduit is comprised of a compliant thermally conductive material.

19. The system of claim 18 in which the compliant thermally conductive material is comprised of an electromagnetic jacket material.

20. The system of claim 18 in which the compliant thermally conductive material is comprised of a spring.

* * * * *